United States Patent [19]

Tan et al.

[11] 4,289,842
[45] Sep. 15, 1981

[54] NEGATIVE-WORKING POLYMERS USEFUL AS ELECTRON BEAM RESISTS

[75] Inventors: Zoilo C. H. Tan, Rochester; Constantine C. Petropoulos, Webster; Frederick J. Rauner, Rochester, all of N.Y.

[73] Assignee: Eastman Kodak Company, Rochester, N.Y.

[21] Appl. No.: 163,470

[22] Filed: Jun. 27, 1980

[51] Int. Cl.$^3$ .............................................. G03C 1/68
[52] U.S. Cl. .................................. 430/270; 430/281; 430/287; 430/296; 204/159.22; 526/288; 526/304; 526/320
[58] Field of Search ............... 430/287, 281, 270, 296; 204/159.22; 526/282, 320, 304

[56] References Cited

U.S. PATENT DOCUMENTS

| | | | |
|---|---|---|---|
| 2,202,846 | 6/1940 | Garvey | 260/78 |
| 3,376,138 | 4/1968 | Gyangualano et al. | 96/35.1 |
| 3,501,445 | 3/1970 | Faust | 260/86.1 |
| 3,554,886 | 1/1971 | Colomb et al. | 204/159.12 |
| 3,556,792 | 1/1971 | Katz | 430/270 |
| 3,556,793 | 1/1971 | Field | 430/270 |
| 3,617,279 | 11/1971 | Laridon | 204/159.23 |
| 4,054,233 | 10/1977 | Cawley | 428/194 |
| 4,123,276 | 10/1978 | Hita et al. | 430/270 |
| 4,133,907 | 1/1979 | Brewer | 427/43 |

FOREIGN PATENT DOCUMENTS 54-41891 12/1979 Japan.
1407312 9/1975 United Kingdom.
1459563 12/1976 United Kingdom.

OTHER PUBLICATIONS

Yau et al., J. Vac. Sci. Technol vol. 15 No. 3 pp. 960–964 (May/Jun. 11978).

Primary Examiner—Jack P. Brammer
Attorney, Agent, or Firm—Dana M. Schmidt

[57] ABSTRACT

Novel acrylate copolymer materials function as electron-beam resists with enhanced sensitivity and enhanced plasma etch resistance. The method of using such materials as an electron-beam resist is also described.

12 Claims, No Drawings

NEGATIVE-WORKING POLYMERS USEFUL AS ELECTRON BEAM RESISTS

1. FIELD OF THE INVENTION

This invention relates to negative-working polymers suitable for exposure to electron beams to form a resist. Such resists are particularly useful in the manufacture of semiconductor devices.

2. BACKGROUND OF THE INVENTION

Electron-beam exposure devices have been found to be a useful tool in providing controlled line exposures of submicron dimensions. Such dimensions, accompanied by strict tolerances, are essential to the production of integrated circuit chips. The procedure is to expose negative-working resists applied to suitable substrates, to electron beams having widths of submicron dimensions. After the resist is developed, the substrate not protected by the resist is etched, usually by a chemical or plasma etching. Examples of such procedures, including the exposure and development of the resist, are described in *J. Vac. Sci. Technol.*, Vol. 15, No. 3, pp. 960-964 (May/June 1979).

One of the difficulties with such a procedure is the scarcity of useful negative-working resists. Not only must the resist demonstrate sensitivity to an electron beam of conventional voltage, but it must also resist deformation and dissolution by the etching process applied to the substrate or base material, usually a semiconductor. More specifically, it is preferred that, for direct writing application the resist have a sensitivity of at least about $2.0 \times 10^{-7}$ coulombs/cm$^2$ at 10 keV, a submicron resolution capability, thermal stability, and a resistance to etching. Such requirements are particularly difficult to achieve in light of the fact that prior studies have suggested that sensitivities in the $10^{-8}$ coulombs/cm$^2$ range produce thermal instability.

A few acrylate copolymers have been described as useful electron-beam resists. Poly(glycidyl methacrylate-coethyl acrylate) is mentioned in the aforesaid article in *J. Vac. Sci. Technol.* However, its sensitivity achieves the desired value of $2 \times 10^{-7}$ coulombs/cm$^2$ at 10 keV, only at relatively high molecular weights. Furthermore, its resistance to plasma etching is not as good as is desired.

An additional poly(acrylate) described as sensitive to electron-beam exposure is a copolymer of 2-hydroxyethyl acrylate and saturated vinyls such as methyl methacrylate and butyl methacrylate. Examples are listed in British Patent Specification No. 1,407,312, but as paints rather than as resists. Of interest is the fact that this patent discredits the hydroxyethyl methacrylate homolog copolymer as being too insensitive to be useful.

Therefore, what is desired is a negative-working resist having a sensitivity to electron beams of at least $2 \times 10^{-7}$ coulombs/cm$^2$ at molecular weights less than 100,000, improved plasma etch resistance, and adequate submicron resolution capability.

SUMMARY OF THE INVENTION

The present invention advantageously features a negative-working resist having the desired electron-beam sensitivity and improved plasma etch resistance noted above.

In a related feature of the invention, a negative-working resist is provided that has, in addition to the above-noted sensitivity, enhanced thermal stability.

More specifically, in accordance with one aspect of the invention there is provided a polymer having a negative-working electron sensitivity of at least $2 \times 10^{-7}$ coulomb/cm$^2$ when exposed to a 10 keV electron beam, the polymer having recurring units with the structure

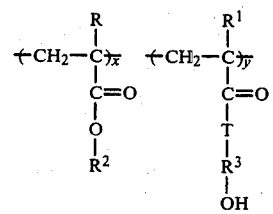

wherein

R and R$^1$ are each independently hydrogen or methyl,

R$^2$ is

n is 1, 2 or 3;

R$^3$ is alkylene of from 1 to 3 carbon atoms;

T is —O— or —NH—, and x and y are mole percents such that $50 \leq x \leq 95$ $5 \leq y \leq 50$.

This polymer comprises the negative-working resist noted above, and can be applied to any suitable substrate as a protective coating.

In another aspect of the invention, a method of imagewise hardening on a substrate, a layer of a resist comprising the polymer described above, comprises the steps of (a) imagewise exposing the layer to electron beam radiation of an energy no greater than about 10 keV; and (b) developing the layer by washing it with a solvent for the unexposed polymer.

Other features and advantages of the invention will become apparent upon reference to the following Description of the Preferred Embodiments.

DESCRIPTION OF THE PREFERRED EMBODIMENTS

The polymers of the invention are hereinafter described primarily as materials useful as electron-beam resists. These polymers are also useful as resists exposed to other forms of high energy radiation, such as x-ray radiation.

It has been discovered that both enhanced sensitivity and enhanced etch resistance are obtained by copolymerizing an unsaturated monomer and a hydroxy alkyl monomer. The polymers of the invention have recurring units of the structure set forth in the Summary. A subclass of polymers having such structure includes those having the structure

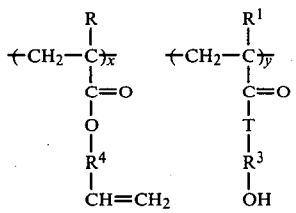

For this subclass, examples of useful R³ and R⁴ groups include, individually, methylene, ethylene, n-propylene and isopropylene.

Specific preferred examples of polymers of this invention include poly[allyl methacrylate-co-(2-hydroxyethyl methacrylate)]; poly[4-butenyl methacrylate-co-(2-hydroxyethyl methacrylate)]; poly[3-norbornenyl methacrylate-co-(2-hydroxyethyl methacrylate]; and poly(allyl methacrylate-co-2-hydroxypropylmethacrylamide).

Other comonomers can be included to form other recurring units in the polymer of the invention, provided that they are compatible—that is, that they do not interfere with the crosslinking of the polymer. Preferably, to insure maximum sensitivity and etch resistance, x and y together comprise at least 80 mole percent of the polymer. Most preferably x plus y totals 100 mole percent and y is between about 25 and 30 mole percent, as it has been found that such polymers, by reason of the increased mole percent of hydroxy groups present, have enhanced plasma etch resistance.

The polymers of the invention have electron-beam sensitivities that meet the above-noted requirement of at least $2 \times 10^{-7}$ coulombs/cm². In several cases, they are much more sensitive than this. Such results are achieved for weight average molecular weights (hereinafter "Mw") that are, in most cases, well below 100,000. Thus, on a per molecular weight basis, the polymers of the invention comprise one of the most sensitive negative-working electron-beam resists available. Electron-beam sensitivities herein described were determined, as is conventional, by exposing identical coatings to increased dosage values and measuring the amount of resist remaining in the exposed area after development. The sensitivity is that dosage required to crosslink enough of the composition to retain 50% of the initial coating thickness.

The molecular weights of useful polymers of the invention can vary widely, as long as the polymer has a low enough viscosity in the solvent of choice to permit it to be coated. It has been found that useful viscosities are generally 0.3 inherent viscosity or less, as measured in N,N-dimethylformamide. However, low molecular weights tend to reduce the electron-beam sensitivity undesirably. Preferably, therefore, the weight average molecular weight of the polymer, as determined by gel permeation chromatography analysis, is between about 20,000 and about 200,000. Most preferably, it is between about 40,000 and 50,000.

There is some evidence that the dispersity of the polymer, as measured by the ratio Mw/Mn where Mn is the number average molecular weight, affects inversely the resolution capability of the polymer. Although this is not considered a critical factor, the most preferred examples of the invention have a polydispersity value of 3.0 or less. The polymers of the invention provide in general a resolution of 0.3 μm line per 1.0 μm space, when exposed to electron beams as described.

The polymers of the invention are prepared by conventional synthesis techniques. It should however be noted that dilute reaction conditions are preferred to avoid undesirable crosslinking. The following preparations are illustrative. The amide monomer of the amide copolymer noted above can be prepared by Preparation No. 17 of British Patent Specification No. 1,463,816.

PREPARATION NO. 1

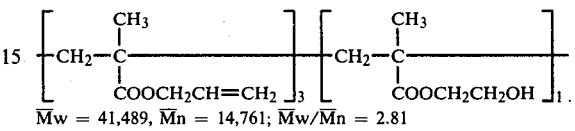

$\overline{Mw} = 41,489; \overline{Mn} = 14,761; \overline{Mw}/\overline{Mn} = 2.81$ A 3 liter reaction vessel was equipped with a magnetic stirrer, heating mantle, reflux condenser, addition funnel, and nitrogen inlet. A solution of 100 g of allyl methacryate, 34.4 g of 2-hydroxyethyl methacrylate, and 1.33 g of 2,2'-azobis(2-methyl propionitrile) in 530 ml of 1,2-dichloroethane (DCE) was added dropwise to 2 liters of stirred, refluxing DCE under a nitrogen atmosphere in the aforementioned vessel. The reaction conditions were maintained for 6 hrs after completion of the addition. When cool, the reaction solution was concentrated to 650 ml under an aspirator-generated-vacuum without heating. The resulting solution was added dropwise to 8 liters of vigorously stirred hexane whereupon the polymer precipitated. The solids were collected on a filter funnel, washed with fresh hexane and dried in vacuo with no heat. 105 g yield.

Elemental analysis: Calc: C 63.8; H 7.90; O 28.3. Found: C 63.6; H 8.30; O 28.1.

Thermogravimetric analysis: Exotherm @ 174° C.

Weight loss—4% @ 68°–134° C.; 0.5% @ 134°–195° C.; 44.5% @ 195°–383° C.; 49% @ 383°–471° C.

PREPARATION NO. 2

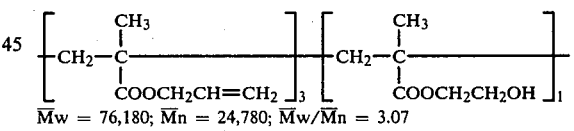

$\overline{Mw} = 76,180; \overline{Mn} = 24,780; \overline{Mw}/\overline{Mn} = 3.07$ A 1 liter reaction vessel was equipped with a mechanical stirrer, addition funnel, reflux condensor, nitrogen inlet and immersed in a 80° C. constant-temperature bath. A solution of 18.9 g of allyl methacrylate, 6.5 g of 2-hydroxyethyl methacrylate, and 50 mg of 2,2'-azobis(2-methyl propionitrile) in 100 ml of N,N-dimethylformamide (DMF) was added dropwise to 375 ml of stirred, refluxing DMF under a nitrogen atmosphere in the aforementioned vessel. Reaction conditions were maintained for 10 hrs. When cool, the reaction solution was added dropwise to 5 liters of water whereupon the polymer precipitated. The solids were collected on a filter funnel, washed with fresh water and dried in vacuo without heating. 16.9 g yield. Inherent viscosity, measured as 0.25 g/dl, was dl/g 0.11 in 1,2-dichloroethane, 0.13 in N,N-dimethylformamide, measured at 25° C.

Elemental analysis: Calc: C 63.8; H 7.9; O 28.3. Found: C 63.1; H 8.2; O 28.7.

PREPARATION NO. 3

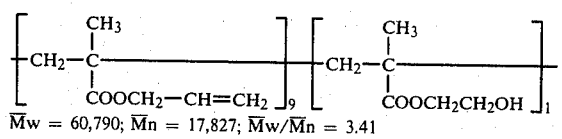

$\overline{M}w = 60{,}790; \overline{M}n = 17{,}827; \overline{M}w/\overline{M}n = 3.41$ A solution of 100 g of allyl methacrylate, 11.5 g of 2-hydroxyethyl methacrylate, and 1.11 g of 2,2'-azobis(2-methyl propionitrile) in 500 ml of DCE was added dropwise to 2 liters of stirred refluxing DCE under a nitrogen atmosphere in a reaction vessel similar to that employed in Preparation No. 1. The reaction conditions were maintained overnight (18 hrs). When cool, 2 mg of hydroquinone was dissolved in the reaction solution. One-half of the solvent was removed under an aspirator-generator vacuum with minimal heating and 579 ml of 2-ethoxyethyl acetate was added. The remaining DCE in the reaction solution was removed as before. A small sample of the resulting solution was added dropwise to stirred ligroin to precipitate the polymer. The solids were collected on a filter funnel, washed with fresh ligroin, and dried.

Elemental analysis: % allyl=84 by carbon analysis. Calc: C 64.8; H 8.0; O 27.2. Found: C 64.8; H 8.6; O 26.6.

Inherent viscosity, measured as 25 g/dl, was 0.09 in dimethylformamide measured at 25° C.

As a resist, the polymers of the invention are preferably coated onto the substrate that is to be etched. The resist is then dried, imagewise exposed, and developed to remove the unexposed portions. Any suitable substrate is useful. Particularly preferred examples include semiconductors such as silicon wafers, chrome-clad glass, and metals such as aluminum.

Conventional solvents are useful for both the coating step and the development step. Preferred examples of solvents useful for either process step include 2-methoxyethyl acetate, 2-ethoxyethyl acetate, 2-ethoxyethanol, 2-butanone and mixtures of these with 2-propanol or ethanol.

Conventional coating procedures are useful to apply the polymer to the substrate. Preferred are whirler or spin coating, brushing, doctor-blade coating, or hopper coating. Further details of such conventional procedures are described in *Product Licensing Index*, Vol. 92, Dec. 1971, Publication No. 9232, at p. 109.

The drying step is conveniently accomplished by baking in an oven, optionally in a vacuum, for example at 90° C. for 30 minutes.

Optionally, a post-bake step is included after exposure and development to enhance adhesion of the final resist coating to the areas to be protected, prior to etching. Such treatment is conventional and requires no further discussion.

Etching of the underlying substrate is achieved by using a chemical solvent for the substrate, or by a plasma gas, both of which are conventional. Etch resistance is measured herein as the rate at which the resist is removed by the etchant, in Å per minute, to reflect the fact that, for a given electron beam exposure level, the resist will have a different starting thickness, depending on the polymer composition.

EXAMPLES

The following examples are included for a further illustration of the invention.

EXAMPLE 1: Poly[allyl methacrylate-co-(2-hydroxyethyl methacrylate)] (75:25) Resist A 20% solution of the polymer of Preparation No. 1 was spun-coated onto a chrome-clad glass substrate out of 2-ethoxyethyl acetate to provide a thickness of 1 μm after drying at 90° C. for 30 minutes. When exposed to an electron beam directed through baffle plates having ¼ inch diameter holes to achieve uniform electron intensity, at 10 keV, this resist had a sensitivity of $1.1 \times 10^{-7}$ coulombs/cm$^2$.

EXAMPLES 2 and 3: Comparison With Other Polyacrylate Resists

The procedure of Example 1 was repeated using the same polymer recurring units as tested in Example 1, except that the polymers were from two different batches of lower molecular weight, coated to produce the same thickness. The weight average molecular weights are indicated in Table I. As a control, poly(allyl methacrylate-co-ethyl methacrylate) (75:25) similar to that described in U.S. Pat. No. 3,376,138 was obtained, coated and tested. The sensitivities are indicated in Table I.

TABLE I

| Example | Polymer | Mw | Sensitivity (Coulombs/cm$^2$) |
|---|---|---|---|
| 2 | poly[allyl methacrylate-co-(2-hydroxyethyl methacrylate)](75:25) | 23,600 | $2 \times 10^{-7}$ |
| 3 | poly[allyl methacrylate-co-(2-hydroxyethyl methacrylate)](75:25) | 19,419 | $1.8 \times 10^{-7}$ |
| Control | poly(allyl methacrylate-co-ethyl methacrylate)(75:25) | 22,000 | $5 \times 10^{-7}$ |

The results of Table I indicate that removing entirely the hydroxy group from the ethyl methacrylate comonomer, all other factors being essentially equal, caused a significant detrimental reduction in sensitivity.

EXAMPLE 4: Demonstration of Improved Etch Resistance

The procedure of Example 1 was repeated using the same polymer recurring units as tested in Example 1, except that again the molecular weight was altered during the preparation of the polymer, as stated in Table II. In addition, after exposure at a dosage rate of at least $3 \times 10^{-7}$ coulombs/cm$^2$, the sample was post-baked at 170° C. for 30 minutes and plasma etched for 3 minutes using a 93/4/3 mixture of CF$_4$, O$_2$ and N$_2$, respectively at 100 μm pressure and 100 watts power, and 20 keV energy. The control was poly(glycidyl methacrylate-co-ethyl acrylate) (72:28) similar to the polymer identified in the aforesaid article in *J. Vac. Sci. Technol.* The resulting etch resistances are listed in Table II.

TABLE II

| Example | Polymer | Mw | Etch Resistance (A/min) |
|---|---|---|---|
| 4 | poly[allyl methacrylate- | 48,700 | 175 |

TABLE II-continued

| Example | Polymer | Mw | Etch Resistance (A/min) |
|---|---|---|---|
| | co-(2-hydroxyethyl methacrylate)]$_{(75:25)}$ | | |
| Control | poly(glycidyl methacrylate-co-ethyl acrylate)$_{(72:28)}$ obtained from KTI/Mead Chemicals Inc. | 192,000 | 350 |

The results of Table II demonstrate that, for plasma etching, and at comparable molecular weights, the polymers of the invention tend to be superior to poly(glycidyl methacrylate-co-ethyl acrylate) (72:28) because less resist is removed per minute.

When the procedure of Example 4 was repeated using, however, Preparation No. 3 having a different comonomer ratio (90:10), it was found that the etch rate of the resist was increased to 1100 Å/min. This less desirable result is a further indication of the preference for polymers containing at least 25 mole percent of the hydroxyethyl comonomer.

EXAMPLES 5-7: Additional Polymer Examples

The procedure of Example 1 was repeated, but using instead the polymers listed in Table III.

TABLE III

| Example | Polymer | Mw | Sensitivity (Coulombs/cm$^2$) |
|---|---|---|---|
| 5 | poly[4-but-1-enyl methylacrylate-co-(2-hydroxyethyl methacrylate)]$_{(75:25)}$ | 64,100 | $7 \times 10^{-8}$ |
| 6 | poly[allyl methacrylate-co-(2-hydroxypropylmethacrylamide)] | 43,094 | $4.5 \times 10^{-7}$* |
| 7 | poly[3-norbornenyl methacrylate-co-(2-hydroxyethyl methacrylate)]$_{(75:25)}$ | 64,078 | $8.6 \times 10^{-8}$ |

*Unlike most of the previous examples, this was tested using a 20 KeV electron beam. As is well known, a beam of half that energy increases the sensitivity value, and it is estimated such increased value would be well within the $2 \times 10^{-7}$ coulomb/cm$^2$ criterion.

COMPARATIVE EXAMPLE

The procedure of Example 1 was repeated, except that the polymer tested was poly[methyl methacrylate-co-(2-hydroxyethyl methacrylate)]$_{(75:25)}$ having a weight-average molecular weight of 34,900. No sensitivity was ascertainable even at dosages of up to $2 \times 10^{-6}$ coulombs/cm$^2$, using a 10 keV energy source. This experiment demonstrates the importance of the presence of the allyl group. Furthermore, it suggests that the failure of 2-hydroxyethyl methacrylate's performance reported in the aforesaid British Patent Specification No. 1,407,312 is not due to the methyl group as reported, but rather is due to the use therewith of the methyl methacrylate comonomer.

The invention has been described in detail with particular reference to preferred embodiments thereof, but it will be understood that variations and modifications can be effected within the spirit and scope of the invention.

What is claimed is:

1. A polymer having a negative-working electron sensitivity of at least $2 \times 10^{-7}$ coulombs/cm$^2$ when exposed to a 10 keV electron beam, said polymer having recurring units with the sructure $$\begin{array}{cc} R & R^1 \\ | & | \\ (\!-\!CH_2\!-\!C\!)\!_{\overline{x}} & (\!-\!CH_2\!-\!C\!)\!_{\overline{y}} \\ | & | \\ C\!=\!O & C\!=\!O \\ | & | \\ O & T \\ | & | \\ R^2 & R^3 \\ & | \\ & OH \end{array}$$

wherein
R and R$^1$ are each independently hydrogen or methyl,
R$^2$ is $$(\!-\!CH_2\!)\!_{\overline{n}} \quad CH\!=\!CH_2 \text{ or}$$

[bicyclic structure];

n is 1, 2, or 3;
R$^3$ is alkylene of from 1 to 3 carbon atoms;
T is —O— or —NH—; and
x and y are mole percents such that
$50 \leq x \leq 95$
$5 \leq y \leq 50$.

2. A polymer having a negative-working electron sensitivity of at least $2 \times 10^{-7}$ coulombs/cm$^2$ when exposed to a 10 keV electron beam, said polymer having recurring units with the structure $$\begin{array}{cc} R & R^1 \\ | & | \\ (\!-\!CH_2\!-\!C\!)\!_{\overline{x}} & (\!-\!CH_2\!-\!C\!)\!_{\overline{y}} \\ | & | \\ C\!=\!O & C\!=\!O \\ | & | \\ O & T \\ | & | \\ R^4 & R^3 \\ | & | \\ CH\!=\!CH_2 & OH \end{array}$$

wherein
R and R$^1$ are each independently hydrogen or methyl,
R$^3$ and R$^4$ are each independently alkylene of from 1 to 3 carbon atoms;
T is —O— or —NH—; and
x and y are mole percents such that
$50 \leq x \leq 95$
$5 \leq y \leq 50$.

3. Poly[allyl methacrylate-co-(2-hydroxyethyl methacrylate)]$_{x:(100-x)}$ wherein x is between about 50 and about 95 mole percent.

4. Poly[4-but-1-enyl methacrylate-co-(2-hydroxyethyl methacrylate)]$_{x:(100-x)}$ wherein x is between about 50 and about 95 mole percent.

5. Poly(allyl methacrylate-co-2-hydroxypropylmethacrylamide)$_{x:(100-x)}$ wherein x is between about 50 and about 95 mole percent.

6. Poly[3-norbornenyl methacrylate-co-(2-hydroxyethyl methacrylate)]$_{x:(100-x)}$ wherein x is between about 50 and about 95 mole percent.

7. A polymer as defined in any one of claims 1 through 6, and further including a substrate bearing said polymer.

8. Poly[allyl methacrylate-co-(2-hydroxyethyl methacrylate)]$_{x:(100-x)}$ wherein x is between about 70 and about 75 mole percent.

9. Poly[but-1-enyl methacrylate-co-(2-hydroxyethyl methacrylate)]$_{x:(100-x)}$ wherein x is between about 70 and about 75 mole percent.

10. Poly(allyl methacrylate-co-2-hydroxypropylmethacrylamide)$_{x:(100-x)}$ wherein x is between about 70 and about 75 mole percent.

11. Poly[3-norbornenyl methacrylate-co-(2-hydroxyethyl methacrylate)]$_{x:(100-x)}$ wherein x is between about 70 and about 75 mole percent.

12. A method of imagewise hardening, on a substrate, a layer of a resist comprising a polymer as defined in any one of claims 1 through 11, said method comprising the steps of
 (a) imagewise exposing said layer to electron beam radiation of an energy no greater than about 10 keV; and
 (b) developing the layer by washing it with a solvent for the unexposed polymer.

* * * * *

UNITED STATES PATENT AND TRADEMARK OFFICE
CERTIFICATE OF CORRECTION

PATENT NO. : 4,289,842
DATED : September 15, 1981
INVENTOR(S) : Z.C.H. Tan, C. C. Petropoulos & F. J. Rauner It is certified that error appears in the above-identified patent and that said Letters Patent are hereby corrected as shown below:

Col. 1, line 25, the part reading "(May/June 1979)" should read --(May/June 1978)--.

Col. 3, line 19, the part reading "methacrylate];" should read --methacrylate)];--.

Col. 4, line 64, the part reading "dl/g 0.11" should read --0.11 dl/g--.

Col. 5, lines 30 & 31, the part reading "25 g/dl, was 0.09 in dimethylformamide" should read --0.25 g/dl, was 0.09 dl/g in N,N-dimethylformamide--.

Col. 6, line 67, the part reading "(A/min)" should read --($\overset{\circ}{A}$/min)--.

Col. 7, line 16, the part reading "acrylate) (72:28) because" should read --acrylate) (72:28) because--.

Signed and Sealed this

Twenty-seventh Day of December 1983

[SEAL]

Attest:

Attesting Officer

GERALD J. MOSSINGHOFF
Commissioner of Patents and Trademarks